United States Patent [19]

Leswin

[11] 4,357,897
[45] Nov. 9, 1982

[54] DEVICE FOR EPITAXIALLY PROVIDING A LAYER OF SEMICONDUCTOR MATERIAL

[75] Inventor: Willem J. Leswin, Eindhoven, Netherlands

[73] Assignee: U.S. Philips Corporation, Tarrytown, N.Y.

[21] Appl. No.: 224,581

[22] Filed: Jan. 12, 1981

[30] Foreign Application Priority Data

Jan. 16, 1980 [NL] Netherlands ............... 8000256

[51] Int. Cl.$^3$ ................................. H01L 21/208
[52] U.S. Cl. ........................ 118/412; 118/415; 118/421
[58] Field of Search ............ 118/412, 415, 421; 156/622; 148/171, 172

[56] References Cited

U.S. PATENT DOCUMENTS 3,665,888 5/1972 Bergh et al. .............. 148/171 X
3,690,965 9/1972 Bergh et al. .............. 148/172

OTHER PUBLICATIONS

Apparatus for Continuous Liquid Phase Epitaxy Growth, Blum et al., IBM Technical Disclosure Bulletin, vol. 15, No. 8, Jan. 1973.

Primary Examiner—John P. McIntosh
Attorney, Agent, or Firm—Ronald J. Meetin; Robert T. Mayer; Thomas A. Briody

[57] ABSTRACT

A liquid-phase epitaxial growth device has a reservoir holder (1), a slider (14) movably mounted below the reservoir holder to enable each reservoir (2, 3, 4, 5) to be selectively uncovered so as to allow semiconductor melt in each reservoir to pass through each aperture (15, 16, 17, 18) in the slider, a movable substrate holder (22) for receiving one or more semiconductor substrates (25, 26) that are placeable below each aperture, and a member (19) for receiving semiconductor melt from each aperture when it is uncovered by movement of the substrate holder. A locking mechanism (30, 31, 32, and 33) enables the slider to be locked to the reservoir holder at one or more substantially fixed positions.

9 Claims, 11 Drawing Figures

DEVICE FOR EPITAXIALLY PROVIDING A LAYER OF SEMICONDUCTOR MATERIAL

BACKGROUND OF THE INVENTION

1. Field of the Invention

The invention relates to a device for epitaxially providing a layer of semiconductor material on a flat side of a substrate, which device comprises a sliding mechanism which has a reservoir holder with at least one reservoir open on its lower side, a slider closing the lower side of the reservoir holder and having at least one aperture to deposit melt from a reservoir of the reservoir holder, which device furthermore comprises a substrate holder in which at least one recess is provided to receive a substrate.

2. Description of the Prior Art

Such a device is disclosed in U.S. Pat. No. 3,690,965. In this known device a defined quantity of melt is deposited from the comparatively large reservoir into the aperture in the slider and an epitaxial layer is grown on the substrate present below the aperture. For the reproducible provision of a layer on a subsequent substrate, a fresh quantity of melt from the reservoir is used. First, however, the used quantity of melt present in the aperture of the slider must be removed. For that purpose, in the known device a number of recesses are present in the substrate holder in which the used melt can be deposited. This known device suffers from disadvantages. The recesses for depositing the melt in the substrate holder have for their result that the dimensions of the sliding mechanism become comparatively large. Since such a recess is present on either side of a location for a substrate, the substrate must already be present below the aperture in the slider when said aperture is filled with melt from the reservoir. The process of growing a layer on the substrate begins immediately. When thick layers are provided, as in the known device, this is still acceptable. However, when a layer is to be provided with an accurate very small thickness, the known device is not satisfactory. The less favourable handleability of the sliding mechanism furthermore makes it difficult to provide several layers on one substrate by means of the known device.

SUMMARY OF THE INVENTION

It is the object of the invention to provide a device of the kind mentioned in the opening paragraph in which measures are taken to prevent the used melt from being drained to the substrate holder, in which the dimensions of the sliding mechanism are maintained within acceptable limits and in which there exists a large freedom in the operation of the device, which makes the device suitable inter alia for providing several layers on one substrate. In order to achieve this object, according to the invention, the sliding mechanism comprises a melt receiving member which is present below the reservoir holder, the substrate holder being movable relative to the melt receiving member and the slider, so that an aperture in the melt deposition slider can be opened to deposit melt present in said aperture into the melt receiving member.

By moving the substrate holder relative to the melt position slider, the aperture in the slider can be released, the melt present in the aperture being drained in into the melt receiving member. Since the substrate holder does not comprise melt receiving means, the handleability is considerably increased. The substrate holder and the melt deposition slider can be operated until successively a number of layers of different composition are grown on a substrate. The substrate may be contacted with the melt at a place laterally apart from the storage reservoir, at such a temperature that layer growth from the just saturated melt begins so as to obtain a very readily defined layer thickness. The device is also suitable to use for this purpose the "source-seed" method in which first a layer is grown on a dummy so as to bring the melt to the saturation condition. The actual substrate is then moved below the melt. Since growth occurs from melt which is just in the saturation condition, a very small layer thickness can also be obtained accurately. Also as a result of separating the substrate holder and the melt receiving means, the substrate holder can easily be taken out of the epitaxy furnace. The melt can then be heated at the desired temperature in the furnace and be degassed, which occupies a considerable period of time. The compositions of the substrates present outside the furnace are not influenced by said temperature treatment. When the melt is in the correct condition, a substrate is introduced into the furnace, heated at the correct temperature in a short period of time, and one or more layers are grown on the substrate. The substrate holder may then be removed from the furnace and a fresh substrate can be introduced for providing one or several epitaxial layers. It is an advantage that the whole heating-up cycle of the furnace need not always be carried out.

In an embodiment according to the invention the sliding mechanism comprises a lock for locking the position of the melt deposition slider relative to the reservoir holder. Herewith it is achieved that a wrong treatment cannot be carried out which disturbs the growth of a layer. The slider is also positioned automatically in a desired position. The locking mechanism preferably consists of a slider which is movable in a vertical direction, the melt deposition slider comprising a slot in which a part of the locking slider can fall.

The locking slider may also be used in determining the location of the substrate holder. For this purpose, according to a further embodiment of the invention, recesses of small depths are present in the substrate holder and can contact the lower side of the locking slider and thus operate as a sensing member for the position of the substrate holder.

BRIEF DESCRIPTION OF THE DRAWING

The invention will be described in greater detail with reference to embodiments shown in the drawing. In the drawing.

DESCRIPTION OF THE PREFERRED EMBODIMENT(S)

Figure 7:
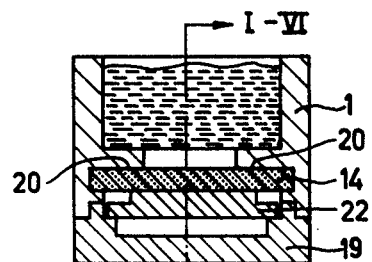
FIG. 7 is a cross-sectional view of the device taken, for example, through the section indicated by arrows VII in FIG. 2.

Reference numeral 1 in the Figures denotes a reservoir holder. In the embodiment shown four reservoirs 2, 3, 4, 5 each comprising a solution 6, 7, 8, 9 are present in the reservoir holder. On their lower sides the reservoirs each have an aperture 10, 11, 12, 13. These apertures can be closed by a slider 14. The slider 14 is guided, for example, by a recess 20 (FIG. 7) in the longitudinal walls of the reservoir holder 1 and comprises an abutment 21 and an abutment 27 for a substrate holder 22. In the embodiment shown the slider 14 has four apertures 15, 16, 17, 18. A melt receiving member 19 is present below the reservoir holder 1. Between the melt receiving member 19 and the slider 14, substrate holder 22 is movable (FIG. 2) in which in the embodiment shown two recesses 23, 24 are present in which substrates 25 and 26 can be provided.

The reservoir holder 1, slider 14, the substrate holder 22 and the melt receiving member 19 are preferably constructed from pure graphite. They can be incorporated in a furnace tube, for example of quartz glass, not shown to avoid complexity of the drawing. This furnace tube can be heated by heating members not shown, for example, in the form of heating coils arranged outside the furnace.

The epitaxial growth of one or more layers of the substrate may then be carried out in the manners described hereinafter. An example has been chosen in which a double hetero junction laser diode structure (DH laser) is manufactured by growing a number of layers of GaAs and GaAlAs on a GaAs substrate. It will be obvious that other applications are also possible, for example, the manufacture of a light-emissive diode. Other compounds or mixtures of the group III-V of the periodic table may also be used.

Figure 1:
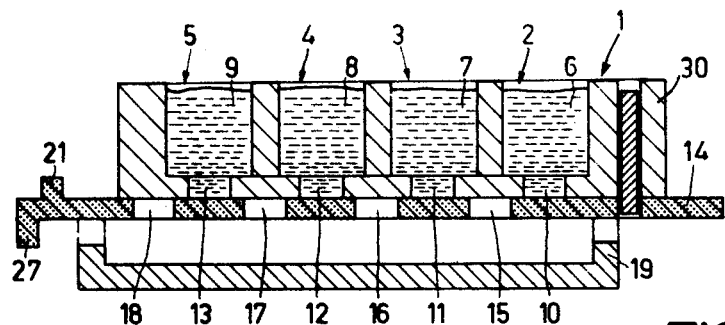
FIGS. 1 to 6 are longitudinal sectional views of a device for the epitaxial growth of layers in various stages of the growth process taken, for example, through the section indicated by arrows I-VI in FIG. 7.
Figure 2:
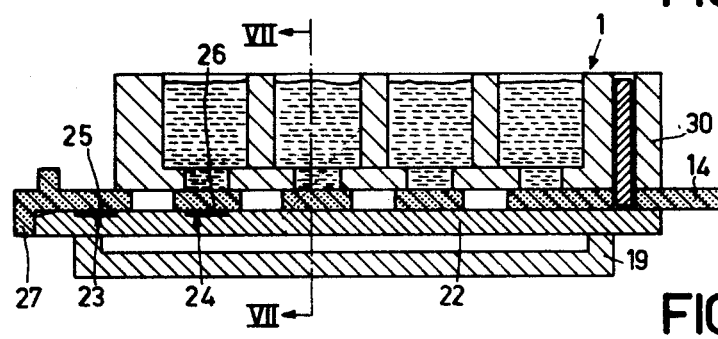

The reservoir holder 1 is provided with a material which is to be grown on a substrate. For this purpose, Ga, GaAs, Al and doping elements may be provided in the reservoirs 2-5 in such a composition that at the growth temperatures in question layers of p-type GaAs, p-type GaAlAs, GaAs and n-type GaAlAs can be grown. The reservoirs are comparatively large; such a quantity of material fits in it that for a large number of substrates each time a fresh quantity of solution from the reservoir may be used for the epitaxial growth of a layer. A further advantage is that the weighing of the materials can be done accurately and no deviation from the desired composition of successive fillings of the reservoirs occurs. The device as shown in FIG. 1 is then provided in the furnace tube. The material present in the reservoirs is melted there and the solutions 6, 7, 8 and 9 are kept for an ample period of time at a temperature above the growth temperature, for example approximately 850° C., for homogenisation and degassing. The substrate holder 22 is then provided in the furnace tube so as to be introduced into the sliding mechanism as shown in FIG. 2. In the embodiment shown two substrates 25 and 26 of GaAs are present in the substrate holder. The substrate 25 after the growth of the layers will form a DH laser structure; the substrate 26 is a so-called source substrate or dummy which should ensure that the solutions in the contact plane with the dummy will be just in the saturation condition.

Figure 8:
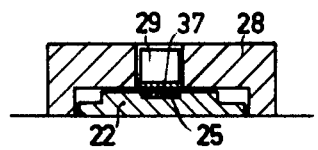
FIG. 8 shows a member to prevent variation in the composition of a substrate during heating.

Before the epitaxial growth of the layers from the solutions begins, the substrates 25 and 26 must be heated at the temperature prevailing in the furnace, which takes approximately a quarter of an hour. In order to prevent the solutions in the reservoirs from cooling too strongly to the point at which crystallisation may take place, the substrates are preferably heated at the desired temperature before the substrate holder 22 is moved into the sliding mechanism. In order to counteract the evaporation of arsenic from the substrates during heating, they may be covered, it being ensured that arsenic vapour is present above the substrates at a vapour pressure exceeding or equal to the equilibrium vapour pressure of arsenic in contact with GaAs at the prevailing furnace temperature. This latter can be done by placing a disk 37 of GaAs above the substrates (as shown in FIG. 8 discussed below), but it is also possible to create arsenic vapour in a small space above the substrates from a source of arsenic vapour placed laterally to them. When the substrate holder is provided in the sliding mechanism until substrate holder 22 abuts against the abutment member 27 of the slider 14, the substrates 25 and 26 are covered by the lower surface of slider 14.

Figure 3:
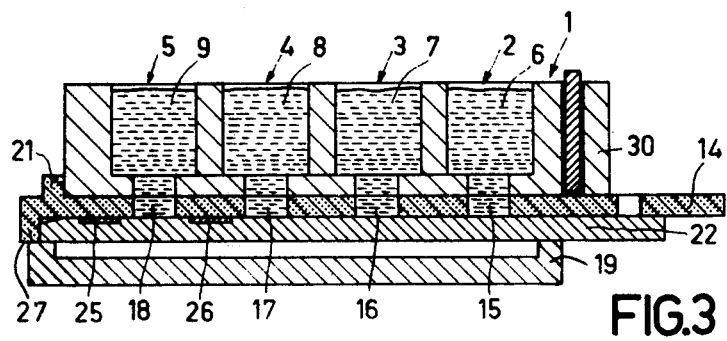

FIG. 3 shows the situation in which the slider 14 is placed relative to reservoir holder 1 in such manner that the apertures 15-18 are each situated below an aperture of the reservoirs 2-5. The abutment member 21 ensures the correct adjustment of the mutual positions. A quantity of solution having a composition of the material present in the associated reservoir flows into the apertures 15-18. For the manufacture of the above-mentioned DH laser structure this may be, for the apertures 15-18, solutions of the materials provided in reservoirs 2-5 from which layers of p-GaAs, p-GaAlAs, GaAs and n-GaAlAs, respectively, can be grown.

Figure 4:
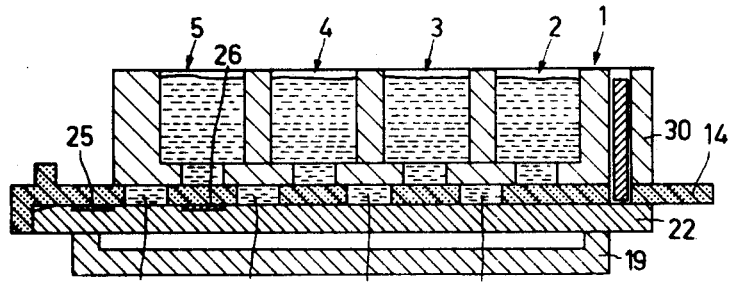

The slider 14, together with substrate holder 22 are now moved to the FIG. 4 position in which a measured-out quantity of solution 6, 7, 8, 9 has deposited from the reservoirs 2-5 into the apertures 15-18. The temperature of the furnace is then rather rapidly reduced to a temperature at which the solutions in the apertures 18 and 17 will be in equilibrium or substantially in equilibrium with the substrates 25 and 26.

Figure 5:
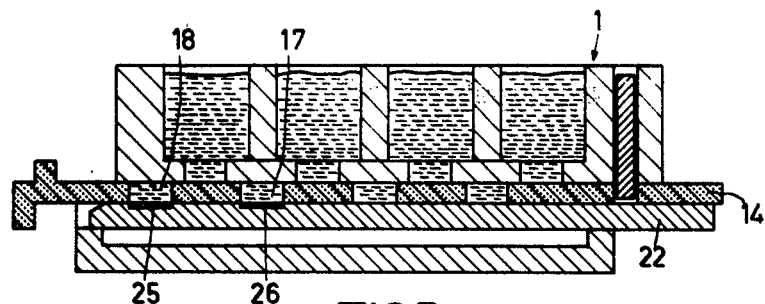

The epitaxial growth of a first layer occurs from a position as shown in FIG. 5 in which the substrates 25 and 26 are moved below the apertures 18 and 17 by sliding substrate holder 22 relative to slider 14. The temperature in the furnace is very slowly reduced, a layer growing from the solutions in the apertures 18 and 17 on the substrates 25 and 26. A first layer of n-type GaAlAs grows on substrate 25, a layer of GaAs grows on dummy 26. The dummy 26 is not used to manufacture a useful product but to ensure that as a result of the growth process the contact surface of the solution is just in the saturation condition.

Figure 6:
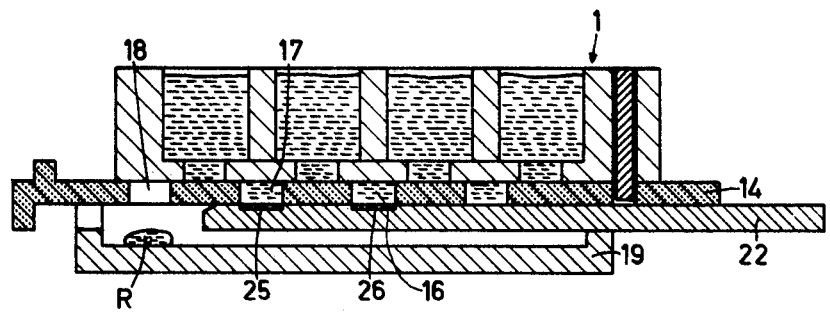

After growing a first layer, the substrate holder is moved to the FIG. 6 position. The solution present in the aperture 18 is deposited into the melt receiving member 19. Substrate 25 is now present below aperture 17. As noted, the contact surface of the solution in aperture 17 with the substrate 25 is just in the saturation condition because of the growth process on dummy 26. The use of the dummy 26 has resulted in the fact that the contribution to the growth rate as a result of undesired over- or undersaturation having become negligible with respect to the growth rate generated by the slow cooling of the solution. The thickness of the layer to be grown can be determined very accurately by means of the cooling rate and time duration. Upon manufacturing DH laser structures of very small layer thicknesses this is extremely important. As already noted, the second layer to be grown on substrate 25 consists of GaAs. Dummy 26 is present below aperture 16 and ensures that the contact surface of the solution in said aperture is brought just to the saturation condition.

Four layers are successively grown epitaxially on substrate 25. Each time when the substrate holder 22 is moved relative to the slider 14, the solution used is deposited in the receiving bin 19. This removal of the used solution increases the handlability of the device considerably.

After providing the layers, the substrate holder is taken out of the furnace, the finished substrate is taken out of it and replaced by a fresh substrate, which is to be provided with layers. The reservoir holder 1 remains in the furnace and need be heated only little to give the solutions again the initial temperature desired for the epitaxial growth. The fresh substrate is guided into the furnace and a new growth process can be carried out in the manner described.

The use of comparatively larger reservoirs and of a receiving member for the used solution situated outside the substrate holder has made it possible to grow epitaxial layers on a large number of substrates, for example, 15 substrates, without removing the reservoir holder from the furnace so as to provide fresh solutions. Fresh solutions are used for each substrate. Since the solutions remain at the furnace temperature, the overall process time is considerably shorter than in the conventional devices for the epitaxial growth of layers.

The use of the device is described with reference to the provision of four epitaxial layers so as to obtain a DH laser structure. It will be obvious that the invention also comprises devices in which more or fewer than four reservoirs are present which can each be provided with a desired solution. For an extremely accurate provision of layers having a very small thickness, a growth process can be carried out in which two dummy substrates are used. In cases in which less critical requirements as regards the layer thickness are imposed, the dummy substrate may be omitted.

FIG. 8 shows that the substrate 25 upon heating in the furnace is covered with plate 37 of GaAs so as to prevent, as already indicated, arsenic from evaporating from the substrate. The plate 37 is present in a holder 28 of carbon and is urged towards substrate 25 by means of a block 29.

Figure 9:
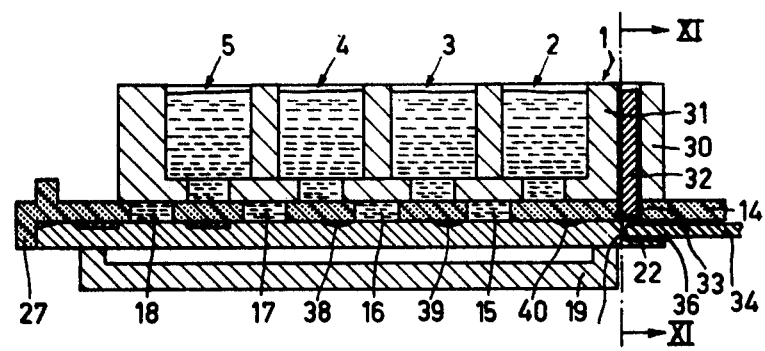
FIG. 9 is a longitudinal sectional view of a device in accordance with the invention having a locking mechanism taken, for example, through the section indicated by arrows IX in FIG. 11.
Figure 10:
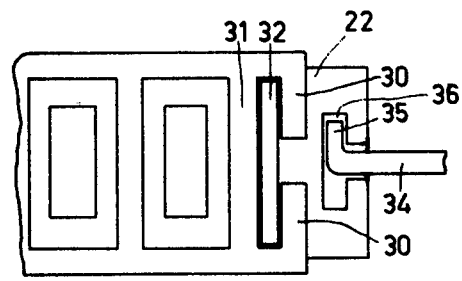
FIG. 10 is a plan view of a part of the device shown in FIG. 9.
Figure 11:
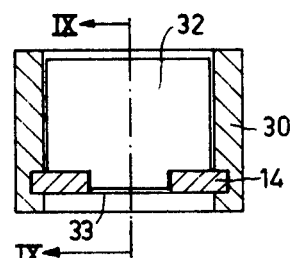
FIG. 11 is a cross-sectional view of said device at the area of the locking mechanism taken, for example, through the section indicated by arrows XI in FIG. 9.

FIGS. 9 to 11 are a longitudinal sectional view, a plan view and a cross-sectional view, respectively, of a device according to the invention, in which means are present to lock the position of the slider 14 relative to the reservoir holder 1, so that also in the case of incorrect operation of the device the solutions in the reservoirs 2 to 5 cannot be lost in that they flow to the receiving member 19 unused. The reservoir holder has arms 30 which together with a wall 31 form a slot in which a locking slider 32 is movable. A slot 33 is provided in the solution slider 14 in which the locking slider 32 can fall in the position in which the apertures 15-18 of slider 14 are present below the lower wall of the reservoir holder 1.

For operation of the device from outside the furnace only one operating rod 34 can now be used. This is provided in the substrate holder 22 and comprises an arm 35 which is situated in a recess 36 of substrate holder 22. When the substrate holder is moved in the sliding mechanism until substrate holder 22 abuts against the abutment member 27 (compare FIG. 2) the arm 35 is just below the locking slider 32. By rotating rod 34 a quarter of a turn, the locking slider 32 can be lifted. Because arm 35 is situated in slot 33 of solution slider 14, a position as shown in FIG. 3 can be reached upon translation of operating rod 34. After having been moved to the position shown in FIG. 4 the slider 14 is locked again by means of locking slider 32, by moving arm 35 again in the recess 36 of the substrate holder 22, which can now be brought to any desired position. On the side facing the locking slider 32 very shallow recesses, as indicated by reference symbols 38, 39, and 40 in FIG. 11, can be provided in the substrate holder in characteristic places. When such a recess passes the locking slider 32, this can be felt at the operating rod 34 and one knows that a certain position of the substrate holder 22 relative to solution slider 14 has been reached.

What is claimed is:

1. A device for epitaxially providing at least one layer of semiconductor material on at least one semiconductor substrate, the device having a reservoir holder which contains at least one reservoir open along a lower surface thereof, a slider which has at least one aperture through it and is movably mounted along the lower surface so as to enable each reservoir to be selectively uncovered therealong to allow semiconductor melt in each reservoir to pass through each aperture, a substrate holder which has at least one recess for receiving at least one semiconductor substrate and is movable with respect to both the slider and the reservoir holder such that each recess is placeable below each aperture, and means below the reservoir holder and separate from the substrate holder for receiving semiconductor melt from each aperture when it is uncovered by sufficient movement of the substrate holder, characterized by means for selectively locking the slider to the reservoir holder at at least one substantially fixed position.

2. A device as in claim 1 characterized in that the means for selectively locking comprises a locking member slidably mounted to the reservoir holder for vertical movement and that the slider has at least one slot for receiving the locking member.

3. A device as in claim 2 characterized in that each slot extends vertically through the slider and that the means for selectively locking comprises a rod rotatably mounted in a cavity in the substrate holder and having an arm for raising the locking member out of each slot.

4. A device as in claim 2 characterized in that each slot extends vertically through the slider, that a first segment of a cavity spaced apart from each recess extends horizontally in a given direction along the upper surface of the substrate holder, that a second segment of the cavity extends horizontally in the substrate holder from a lateral edge thereof to the first segment in a direction generally transverse to the given direction, that the means for selectively locking further includes a rod rotatably mounted in the first segment and having an arm that extends transverse to the given direction and fits in the second segment, and that the substrate holder is so movable as to place the second segment below each slot when the member is positioned therein, whereby rotation of the rod to turn the arm upward raises the locking member to unlock the slider from the reservoir holder.

5. A device as in claim 3 or 4 characterized in that rotation of the rod to turn the arm upward into each slot when the slider is not locked to the reservoir holder locks the slider to the substrate holder, whereby movement of the slider and the reservoir holder is controllable with the rod.

6. A device as in claim 5 characterized by means comprising a plurality of shallow recesses along the upper surface of the substrate holder where it contacts the locking member when the substrate holder is moved for sensing the position of the substrate holder.

7. A device as in claim 6 characterized in that the reservoir holder and the means for receiving semiconductor melt together have channels in which the slider and substrate holder slide.

8. A device as in claim 1 characterized by means placeable over each recess for inhibiting evaporation of a semiconductor impurity from a semiconductor substrate in each recess.

9. A device as in claim 8 characterized in that the means for inhibiting comprises a supporting structure placeable over the substrate holder and having a hole vertically therethrough, a source of the impurity slideably mounted in the hole, and a block slideably mounted in the hole adjacent to and above the source for urging the source toward each substrate when it is therebelow.

* * * * *